(12) United States Patent
Childs et al.

(10) Patent No.: US 6,317,417 B1
(45) Date of Patent: Nov. 13, 2001

(54) METHOD AND APPARATUS FOR DYNAMIC SIGNAL MODIFICATION ON A PARALLEL BUS

(75) Inventors: Keith Childs, Whitinsville; Fee Lee, Framingham, both of MA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/166,410

(22) Filed: Oct. 5, 1998

(51) Int. Cl.[7] .................................................. H03K 5/13
(52) U.S. Cl. ..................... 370/252; 370/462; 370/502; 710/107; 327/262
(58) Field of Search ................................. 370/242, 243, 370/248, 252, 253, 235, 498, 501, 502, 516, 517, 462; 327/261, 262; 710/107, 119

(56) References Cited

U.S. PATENT DOCUMENTS

| | | | |
|---|---|---|---|
| 5,087,842 | 2/1992 | Pulsipher et al. | 307/603 |
| 5,237,695 * | 8/1993 | Skokan et al. | 395/725 |
| 5,528,765 * | 6/1996 | Milligan | 395/287 |
| 6,025,745 * | 2/2000 | Lee et al. | 327/277 |
| 6,154,799 * | 11/2000 | Gafford et al. | 710/107 |
| 6,223,235 * | 4/2001 | Cheng | 710/107 |

* cited by examiner

Primary Examiner—Ricky Ngo
(74) Attorney, Agent, or Firm—Philip L. Conrad; William J. Kubida; Hogan & Hartson LLP

(57) ABSTRACT

A SCSI bus expander provides signal conditioning for transmitted data pulses that is particular to a negotiated data transfer rate. The expander monitors the bus arbitration to determine the devices involved in the transfer, and thereafter monitors the data transfer rate negotiations to determine the transfer rate to be used by that particular combination of devices. An indication of the transfer rate is stored in a memory device at an address determined by the device IDs. The transfer rate is then used to select tap values for tap lines that modify the pulse width and/or a propagation delay of the pulse, so as to correct for signal degradation and to align it better relative to other signals during data transmission. The specific tap values may vary for the different combinations of transmitting and receiving devices involved in the transfer, since the manner in which the pulse characteristics should be modified may be different for different transmission rates.

24 Claims, 7 Drawing Sheets

METHOD AND APPARATUS FOR DYNAMIC SIGNAL MODIFICATION ON A PARALLEL BUS

FIELD OF THE INVENTION

This invention relates generally to the control of the signal characteristics of electronic signals and, more particularly, to the control of the characteristics of digital signal pulses transmitted on a parallel communication path.

BACKGROUND OF THE INVENTION

A common type of parallel bus is one that transmits signals in accordance with the Small Computer Standard Interface (SCSI) protocol. Such a bus has many conductors, including a plurality of parallel data lines and a clock line. Due to switching transients in the bus drivers and other circuitry, data signals on the plurality of data wires are stable during certain time intervals and unstable during other time intervals. It is important that devices connected to the bus read the data lines only during the time intervals during which the data signals are stable. Consequently, a signal on the clock wire is used to control the time period during which devices connected to the bus read data from the data lines.

The conventional SCSI bus arrangement works well, but limits the physical length of a SCSI bus. The data and clock signals propagate down the bus lines at slightly different speeds due to a variety of factors, and, as the bus gets longer, the differences in propagation speeds cause the data signals to arrive at a given point at different times, a phenomenon called "skew." If the skew becomes large enough, it may shift the arrival of a data signal relative to the clock signal at a peripheral device by an amount sufficient to cause the data signal to be read in its unstable region, thereby causing a data error.

One prior art solution to this problem is to use a "store and forward" buffer system. In this arrangement, signals on the bus are received and stored until signals are received for each bus line. When all signals have been received, the signals are simultaneously retransmitted on another SCSI bus, thereby overcoming the skew problem. However, SCSI busses have a number of timing requirements that restrict the use of the buffering approach. For example, in accordance with conventional operation, a host computer transmits a signal to a peripheral device which then sends a signal back to the host. The host waits a predetermined amount of time to receive the response from the device. If a response is not received from the device in the predetermined amount of time, the message is considered as not received. This operation prevents any open-ended communications between a host and a peripheral device.

A certain amount of time is required for a signal to propagate from a host computer to the peripheral device. Accordingly, if an extremely long cable is used, the propagation time may be longer than the predetermined time that the host is going to wait. The prior art method of storing signals in a buffer exacerbates this problem and, if buffering is used, the SCSI bus cables must be physically shortened to accommodate the time lost while the information is stored in a buffer. In addition to the skew problem, the prior art buffering method is not effective for high-speed lines since it slows down transmission between two SCSI busses.

Another prior art method for overcoming the skewing problem is to introduce a delay circuit into each bus line at a remote position along the SCSI bus after the clock and data signals have traveled through the bus. Digital delay circuits are known in the art, and are used to generate an output signal that is a replica of an input signal, but which has pulse widths (i.e. the duration of its digital pulses) which are longer than that of the input signal. The delay circuits realign the bus signals to eliminate skew. One type of delay circuit utilized for this purpose is constructed from discrete circuit elements. This type of delay circuit does not provide consistent delay times because the delay times through the discrete elements can vary significantly with fluctuating operating conditions, such as temperature and voltage. Different variables in the manufacturing processes used to manufacture the discrete elements can also create variances from unit to unit. To overcome the latter problems, some circuits are manufactured by laser trimming some of the components after the circuit is assembled on a circuit-by-circuit basis in order to provide more accurate propagation delays. This is not economically desirable, however, because of the extra cost associated with the laser trimming process.

Other prior art devices use tunable delay circuits. These latter circuits monitor the actual delay times and adjust themselves to provide more consistent, non-varying delay times. For example, U.S. Pat. No. 5,087,842 (Pulsipher et al.), discloses a self-adjusting delay circuit that includes a set of voltage controlled delay elements in each bus line. A ring oscillator is constructed with the same voltage controlled delay element used in the bus lines. The output of the ring oscillator which is indicative of the actual delay time through each of the delay elements is provided to an external microprocessor that adjusts all of the delay elements including that in the ring oscillator until the delay as measured by the ring oscillator meets a predetermined value.

One other device is described in U.S. patent application Ser. No. 08/881,436, and makes use of a delay device that produces a substantially constant delay time. A delay circuit with a tapped delay element line and a multiplexer are used to select the signal at one of the taps to produce a variable delay through the circuit. A counter is used to count pulses produced by the oscillator, and a computation circuit for calculating the appropriate tap to select with the multiplexer.

SUMMARY OF THE INVENTION

The present invention provides an "expander" for a data transmission path that does adaptive pulse characteristic modification for the data transmitted along the data path. The expander reconditions each data pulse to compensate for pulse degradation, and optimize the pulse for a transmission rate used during the time that the pulse is transmitted. The invention includes a pulse receiving element and a pulse transmitting element that retransmits the received pulse with the desired modification, or modifications, to the pulse. This modification is relative to the transmission rate, and changes the pulse such that its transmission performance is improved at the determined transmission rate. in the preferred embodiment, the modified characteristic may be either or both of the pulse width and a propagation delay of the pulse relative to a second pulse.

The transmission path is accessible to a plurality of devices, each of which is capable of transmitting signal pulses over it, and receiving signal pulses from it. The transmission rate may be different for different combinations of transmitting and receiving devices. In the preferred embodiment, the transmission path is a SCSI bus, and each of the devices has an assigned identification (ID) value. Prior to a transmission, the transmission rate is negotiated between the two devices involved in the transmission. The invention monitors these negotiations, and determines the selected rate. A memory storage device is used to store an indication of the transmission rate for each combination of transmitting and receiving devices. After these values are stored for each combination of transmitting and receiving device, monitoring the negotiations for transmission rate is no longer necessary, since the value should always be the same for a given combination of devices, and has already been stored relative to that combination. Preferably, the device IDs themselves are used as an address to the appropriate storage location for a given rate.

In the preferred embodiment, the transmitting and receiving elements are the components of a delay line, which is capable of delaying the rising or the falling edge of a given pulse based on the delay line tap values provided to it. Indeed, several delay lines are preferably used, to provide desired pulse modifications to both pulse width and propagation delay, and to do so for different directions of data transmission along the transmission path. A stored value for each combination of device IDs may have encoded within it the desired tap values for the appropriate delay lines. Thus, once the different transmission rates have been determined for each combination of devices, the detection of those IDs prior to a data transmission may be used to provide the appropriate tap values to the delay lines involved in the transmission. Thereafter, the transmitted data pulses will be modified accordingly.

DETAILED DESCRIPTION OF THE ILLUSTRATIVE EMBODIMENT

Figure 1:
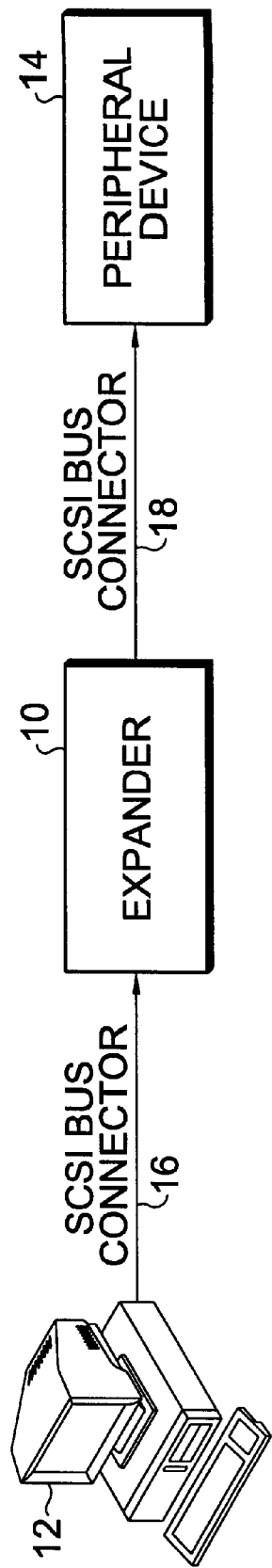
FIG. 1 is a block diagram showing an expander according to the present invention connected between two portions of a parallel bus.

FIG. 1 shows an exemplary use of an "expander" circuit 10 according to the preferred embodiment that is located between two portions 16, 18 of a parallel bus which, in the preferred embodiment, is a SCSI bus. In the figure, a computer 12 is shown connected to the bus to a first side of the expander 10, while an external peripheral device 14 is connected to the bus to the other side of the expander 10. However, those skilled in the art will recognize that any two devices which are connected to the bus on opposite sides of the expander may function as target and initiator, and that the expander functions in each of those situations.

Due to the signal skew problems discussed above, the physical length of a SCSI bus employing more recent, higher speed data transfer rates (such as "fast twenty" and "fast forty"), would have to be limited to roughly three meters for "single-ended" bus cables, although differential SCSI buses can be longer. However, the expander 10 reconditions the signals on the bus, allowing for much longer bus lengths to be used. The manner in which this is accomplished is discussed in more detail below.

The expander 10 modifies the signals being transmitted along the bus to be maximized for both efficiency and lack of skewing. To do this, it alters the signals relative to the data transmission rate used during their transfer. This transmission rate is a negotiated factor, and can be different, depending on the capabilities of the two devices involved in the transfer. The preferred embodiment is based on a negotiation conducted using a SCSI protocol, but may be applied to other systems as well.

In SCSI systems, it is necessary to decide which of the devices connected to the bus has control of the bus at any point in time. Providing such control typically requires arbitration between the devices. Currently, this arbitration involves assigning each of the devices a permanent ID value, which gives it a particular priority relative to the other devices connected to the bus. During arbitration for control of the bus, the device with the highest priority ID value wins the arbitration. The other devices withdraw from contention, giving the high priority device control of the bus. Thereafter, in a "selection" phase, the ID values of the two devices that will be involved in the data transfer are placed on the bus by the winning device, and the two devices thereafter negotiate for an appropriate transfer rate. The expander 10 of the preferred embodiment eavesdrops on these communications, and uses the information as a basis for appropriately conditioning the data signals subsequently transferred along the bus.

Figure 2:
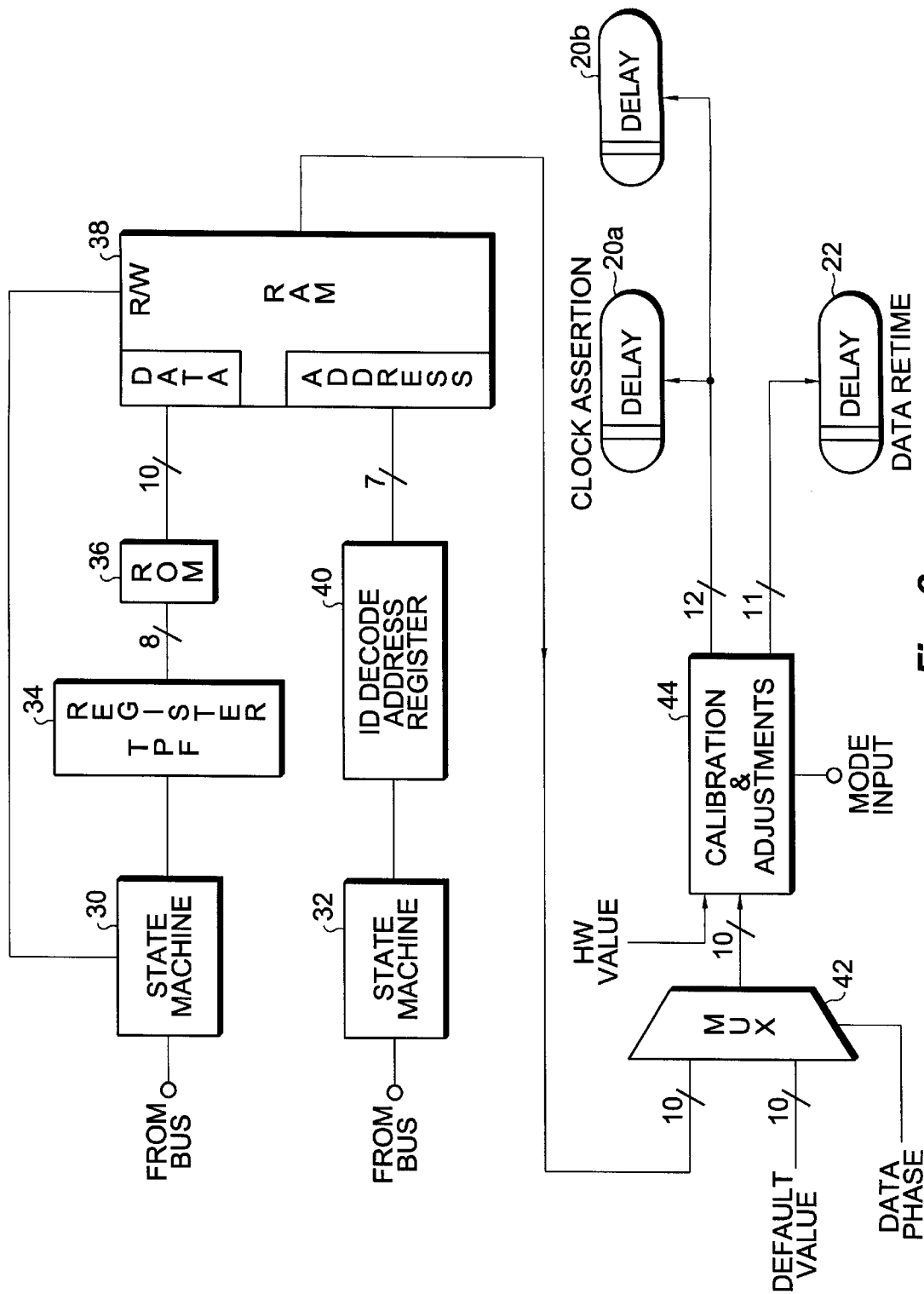
FIG. 2 is a schematic illustration of the expander shown in FIG. 1

The schematic depiction of FIG. 2 shows expander 10 in more detail. All of the components shown in the figure are preferably integrated into a single IC chip, although it is not necessary to do so. The expander receives each of the conductors of the bus portions 16 and 18 shown in FIG. 1, and provides the necessary communication between them. The signals received by the expander from either of the bus portions are regenerated on the other bus portion, thus providing the necessary communication link between the two portions of the bus. However, to provide the desired conditioning of the data transfer control signals, delay lines 20a, 20b and 22 are used. These delay lines are used to delay and retime the signal used as a clock signal during a data transfer, the modifications being specific to a given data transfer rate.

In the preferred embodiment, separate delay lines are used for each of the two directions of data transfer. These delay lines may be as described in U.S. patent application No. 08/881,436, although other conventional delay lines may be used as well. The SCSI signals to be modified using the delay lines are the "REQ" and the "ACK" signals, although each will be modified at a different time. When data is transferred from a target to an initiator, the "REQ" signal functions as the trigger, or "clock." When data is transferred from an initiator to a target, "ACK" is used. To allow for both target and initiator transfer in each direction through the expander, two sets of delay lines are used, one for each data transfer direction. For simplicity in FIG. 2, however, only one of the two sets is shown. Those skilled in the art will recognize that a duplicate set of delay lines receiving the same inputs would typically be used for data transfer in the opposite direction.

The delay lines shown in FIG. 2 include two "clock assertion" delay lines 20a, 20b, and a "data retime" delay line 22. The clock assertion delay lines 20a, 20b are used to adjust the width of the clock pulses in any given data transfer. The data retime delay line is used to delay the clock pulses, and thereby modify the setup and hold times for the data. Two clock assertion delay lines are used because, in each data phase, there will be exchanges of "REQ" and "ACK" signals for handshaking purposes. While the clock width need only be adjusted in the direction of the data transfer to optimize the data transfer, it is also desirable to widen the "ACK" or "REQ" signal being sent back the other direction, since pulse width degradation would otherwise have a similar effect on that signal as well. The data retime delay, on the other hand, is of no benefit for the signal (either "REQ" or "ACK") that is being used for handshaking purposes only. Therefore, only one data retime delay line is used for each direction of data transfer.

Figure 3:
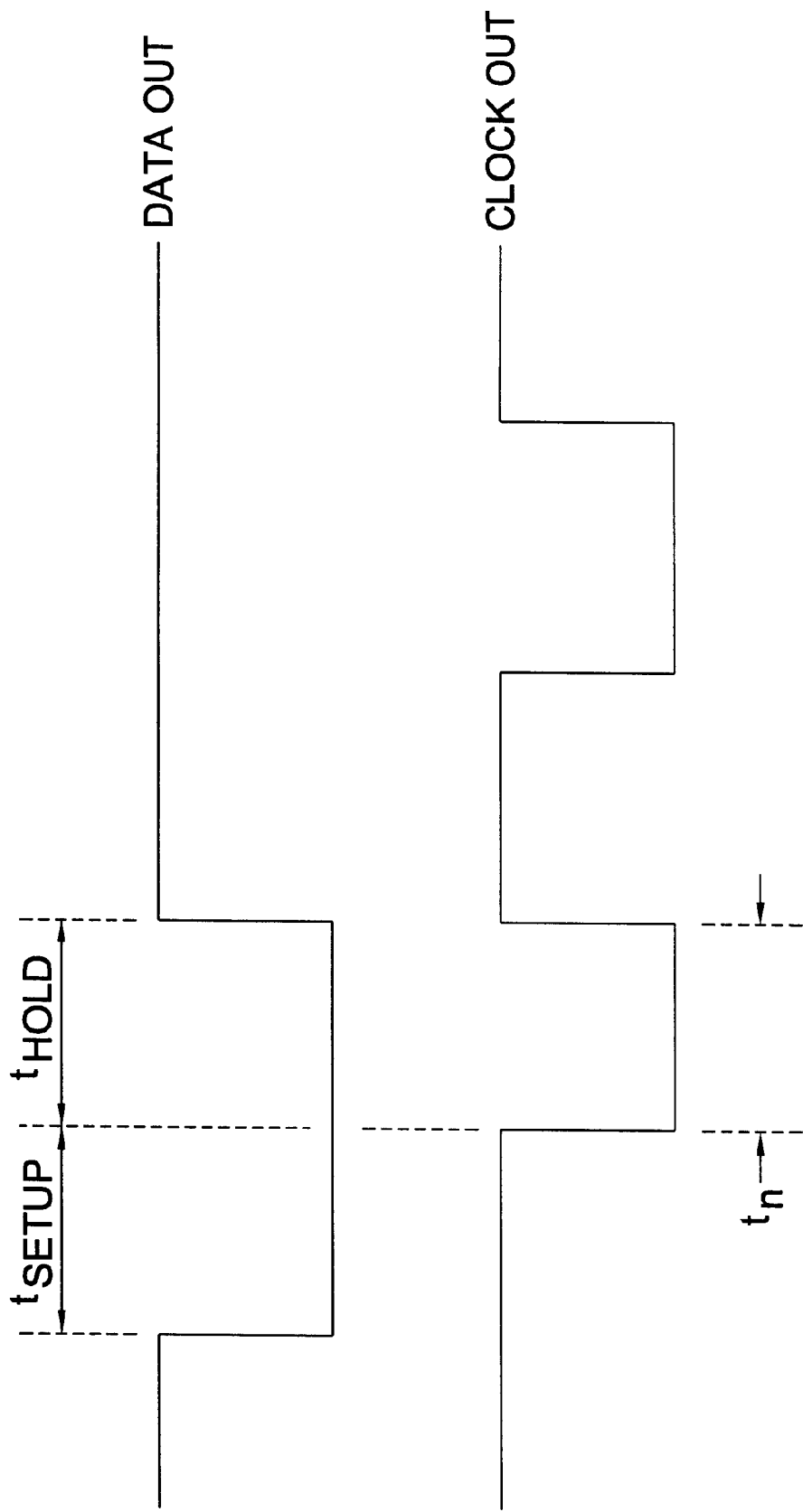
FIG. 3 is a timing diagram showing the relative timing between a data signal and a clock signal on a SCSI bus using the present invention.

Understanding of the arrangement of elements shown in FIG. 2 is aided by a discussion of a desired arrangement of signals output by the expander. In optimizing the conditioning of these signals, the present invention both increases the width of the clock pulses, and realigns the clock pulses relative to the data pulses. FIG. 3 is a timing diagram showing the "clock" signal output from the expander, along with a "data" signal triggered by the clock.

The signals shown in FIG. 3 display three relevant time periods. The clockwidth $t_n$ is half of the period of the "clock out" signal. The "data out" signal includes a "setup" time (labeled $t_{setup}$) and a "hold" time (labeled $t_{hold}$). Other systems have, in the past, simply delayed the data signal by a constant time relative to the clock pulse, and added a finite amount of time to the clockwidth, thereby ensuring that the hold time was long enough. However, this resulted in a very inefficient system when used with SCSI devices that could negotiate for different data transfer rates.

The present invention adapts itself to the different transfer rates used by the devices of the system, and thereby optimizes the signal efficiency. To do so, the clockwidth is adjusted to best fit the negotiated transfer rate. Meanwhile, the clock waveform is delayed such that the setup time, $t_{setup}$, is just slightly less that the clockwidth. In the preferred embodiment, $t_{setup}$=clockwidth 31 5 ns. The period $t_{hold}$ is itself is equal to the clockwidth, and is slightly greater then one half the data pulse width. Thus, through controlling the clock pulse, the data pulse is kept substantially centered relative to the leading edge of the clock, and the clock pulse is widened enough to provide the necessary data hold time. The actual width of the pulses, of course, depends on the selected data transfer rate.

As shown in FIG. 2, the expander has two state machines 30, 32 that detect signals from the bus. State machine 32 is used to monitor the SCSI bus for the arbitration and selection phases, and to extract the ID values of the two devices that will be participating in the subsequent data transfer. State machine 30 is used to monitor the bus for a "synchronous data transfer rate" (SDTR) message that, in SCSI protocol, indicates a negotiation for data transfer rate. This transfer rate is expressed in terms of a "transfer period factor" (TPF) which is ¼ the actual data transfer period (in nanoseconds). The negotiated TPF value is stored in a TPF register, and is used as an address into a read only memory (ROM) 36. The output from the ROM at this address is then written into random access memory (RAM) 38. The output from the ROM 36 is a "TPF code" which indicates a particular set of tap values to be input to the delay lines 20a, 20b, and 22. The address at which the ROM output is stored in RAM 38 is determined by the IDs of the two communicating devices, which are detected by state machine 32 during the arbitration and selection phases. The specific combination of IDs is converted into a single address by ID decode address register 40, and that address is output to RAM 38. Thus, the TPF code is stored in RAM 38 at a location unique to the two devices involved in the data transfer.

When a TPF code is output from RAM 38, it is input to multiplexer 42. A second input to multiplexer 42 is a default TPF code. The default value is a constant value which is satisfactory for all data rates up to fast twenty, but which is not optimized according to the data rate (the default value will not work with rates above fast twenty).

The selection of the multiplexer output is done using a "data phase" input. To confirm the proper SCSI phase, the state of four signals: "busy" (BSY); "select" (SEL); "command/data" (CD); and "message" (MSG) are examined. When BSY equals 1, and each of SEL, MSG and CD equal 0, a SCSI data transfer is indicated, and the multiplexer 42 is switched so that the optimized TPF code, rather than the default value, is output. The data phase input is preferably a single-bit input, and combinational logic (not shown), such as an AND gate with the appropriate input inverters, may be used to produce the data phase input from the four SCSI signals mentioned above.

The output of multiplexer 42 is transferred to a calibration and adjustment unit 44. The modifications made by the unit 44 provide the final values for transmission to the delay lines 20a, 20b, and 22. First, the "calibration" operations are done. These are adjustments to the TPF code received by the unit 44 that compensate for variations in dynamic conditions surrounding the system, such as voltage and temperature. These calibrations are made by comparing the output of the multiplexer 42 to a hardwired value provided at another input of the calibration unit 44. These types of "chip-to-chip" variations are known in the art, as are the techniques used to compensate for them. The second modification done to the TPF code is the adjustments for the specific delay lines. A "mode" input to the unit 44 indicates the SCSI mode in which the system is operating (e.g., single-ended, low voltage differential, high voltage differential). Since different modes have different physical parameters, this ensures that the tap values provided to the delay lines are appropriate for the specific application.

Figure 4A:
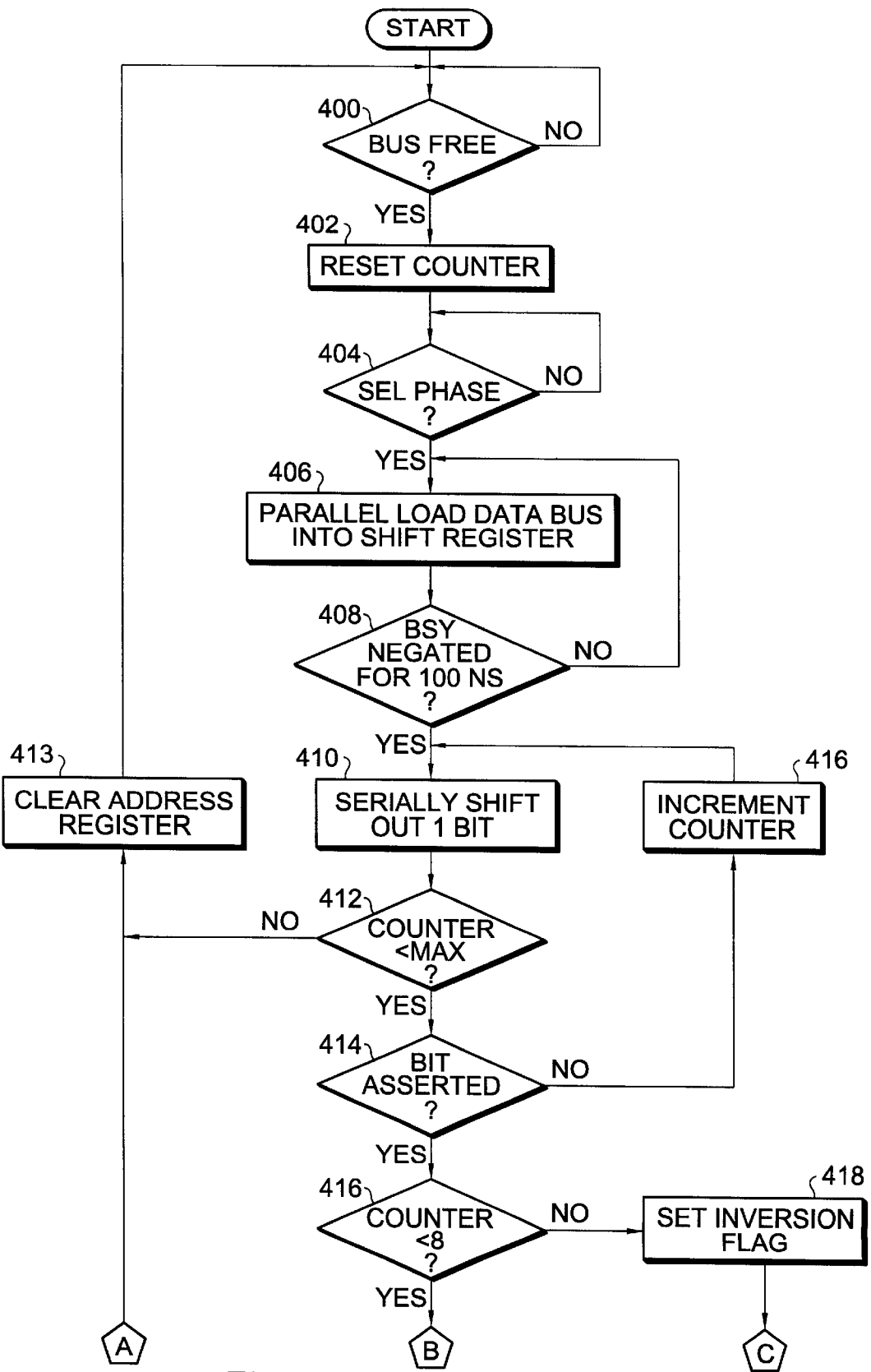
FIGS. 4A–4B together form a flowchart showing the series of steps followed by the expander when extracting the target and initiator ID information of two devices communicating over the bus on which the expander operates.
Figure 4B:
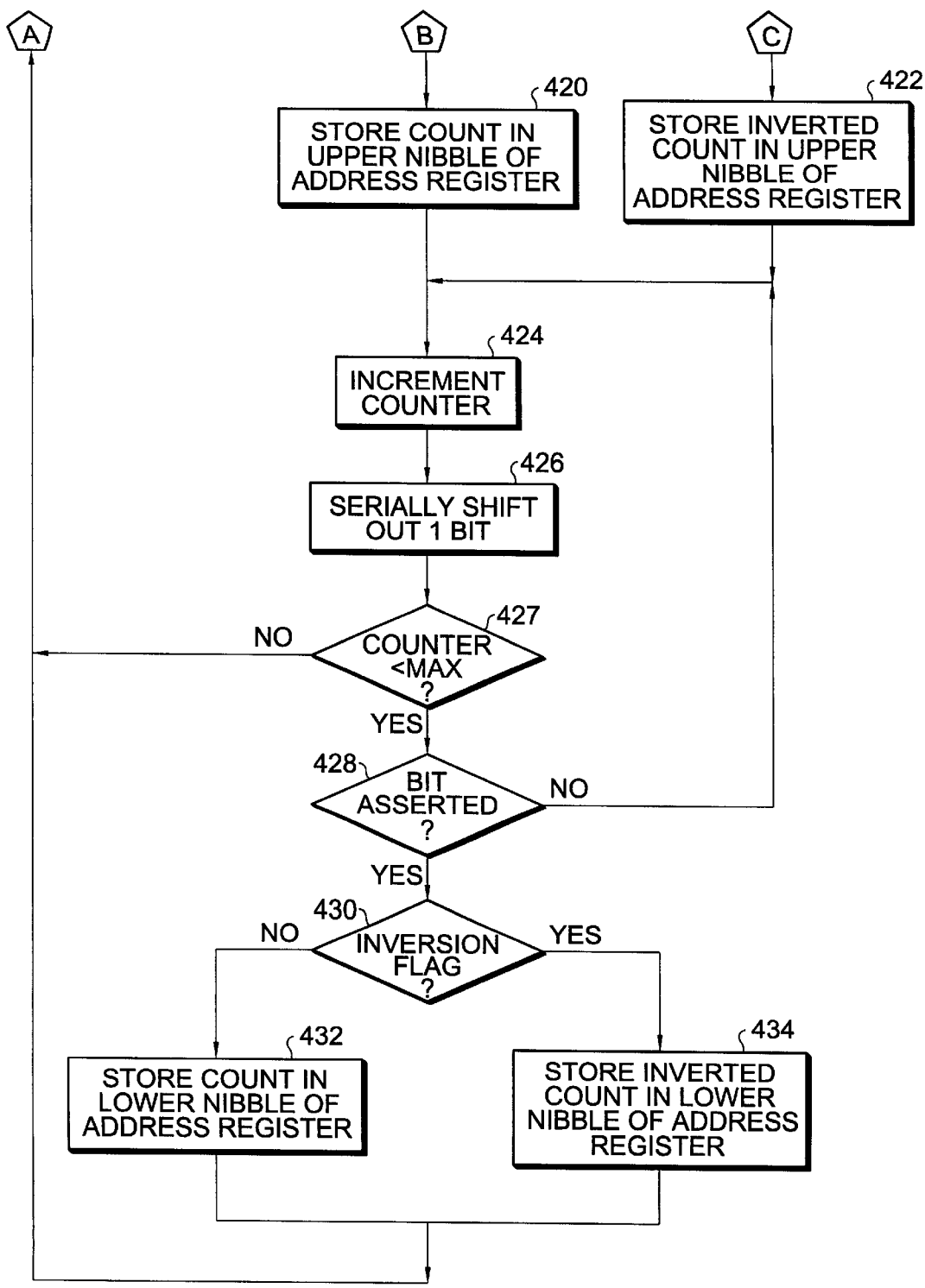

The particular steps performed by the expander are depicted in the flow diagrams of FIGS. 4A–4B and 5A–5B. FIGS. 4A–4B describe the steps that the state machine 32 follows during extraction of the target and initiator IDs, and are described first below.

In step 400, the BSY signal is monitored until its assertion level indicates that the bus is free. In this step, signals on the bus (other than BSY and SEL) must also be negated, to be sure that there is no other traffic on the bus. When the bus is free, the state machine 30 proceeds to step 402, in which a counter is reset. In step 404, the bus is then monitored until a "selection" phase has begun. This is indicated by SEL being asserted and BSY being negated. When this occurs, the signals on the data lines of the bus are parallel loaded into a register internal to the state machine. Under SCSI arbitration rules, these data lines indicate the ID values of the two devices to be involved in the upcoming data transfer. The validity of the data is confirmed by testing that BSY is negated for 100 ns (step 408). If this test fails, the process returns to step 406 to reload the data. If the data is validated, the state machine proceeds to step 410.

In step 410, the data that was parallel loaded into the state machine is used to determine the ID values. This is accomplished by serially shifting out the data and incrementing the counter for each shift, noting which bits shifted out are asserted. As shown, a bit is shifted out in step 410, after which the counter is tested to confirm that the last bit has not been shifted out (step 412). In the exemplary embodiment, sixteen would be the value for "MAX," as current SCSI buses use sixteen data lines. However, this value may be different for other SCSI bus sizes. For the present embodiment, the maximum of sixteen devices means a maximum of sixteen SCSI IDs, and a four-bit counter may therefore be used. If the last bit has been shifted out in step 412, an error is determined to have occurred, and the address register is cleared in step 413, after which the process returns to step 400. If the last value of the counter has not been reached in step 412, the last bit shifted out is tested to determine whether it is asserted (step 414). If not, the counter is incremented in step 416, and the process returns to step 410.

If the bit tested in step 414 is asserted, the value of the counter indicates the ID value of one of the devices that will participate in the data transfer. This first device ID detected may be any of the first fifteen IDs. However, it is desirable to store the data in an efficient manner, so each of the device IDs will be stored in a different nibble of a single byte. In order to accomplish this, it is necessary to ensure that the two bits indicating the two devices will not overlap each other, since there are a total of sixteen different possible IDs. Therefore, in step 416, the counter output is tested to determine whether it is less than eight, since a count equal to or higher than eight would have a bit asserted in its upper nibble. If the count is not less than eight, an inversion flag is set (step 418) indicating that the counter output for each of the two device IDs is to be inverted before being stored in the ID decode address register 40.

The process flow continues in FIG. 4B. As shown, the counter output is stored in the upper nibble of the address register 40. If the inversion flag was not set, it is stored directly in the upper nibble (step 420). If the inversion flag was set, the counter output is inverted and then stored in the upper nibble of the address register 40 (step 422). The counter is then incremented in step 424, and another bit is serially shifted out (step 426). After this, the counter is checked to confirm that the count is less than the maximum number (step 427). If the maximum count has been reached, an error has occurred and the process returns to step 400, clearing the address register first in step 413. If the count is sixteen or less, the new bit is tested in step 428 to determine whether it is asserted and, if not, the process returns to step 424. If the bit is asserted, the second ID has been determined. Before storing it, however, the inversion flag must be tested in step 430. If the flag is not set, the count is stored directly in the lower nibble of the address register 40 (step 432). If the flag is set, the count is inverted, and then stored in the lower nibble of register 40. At this point, the appropriate address has been set in the register, and the process returns to monitoring the bus in step 400, waiting for the next arbitration cycle. When the RAM is set to "write", its output will be taken from the address indicated by the input from register 40.

Figure 5A:
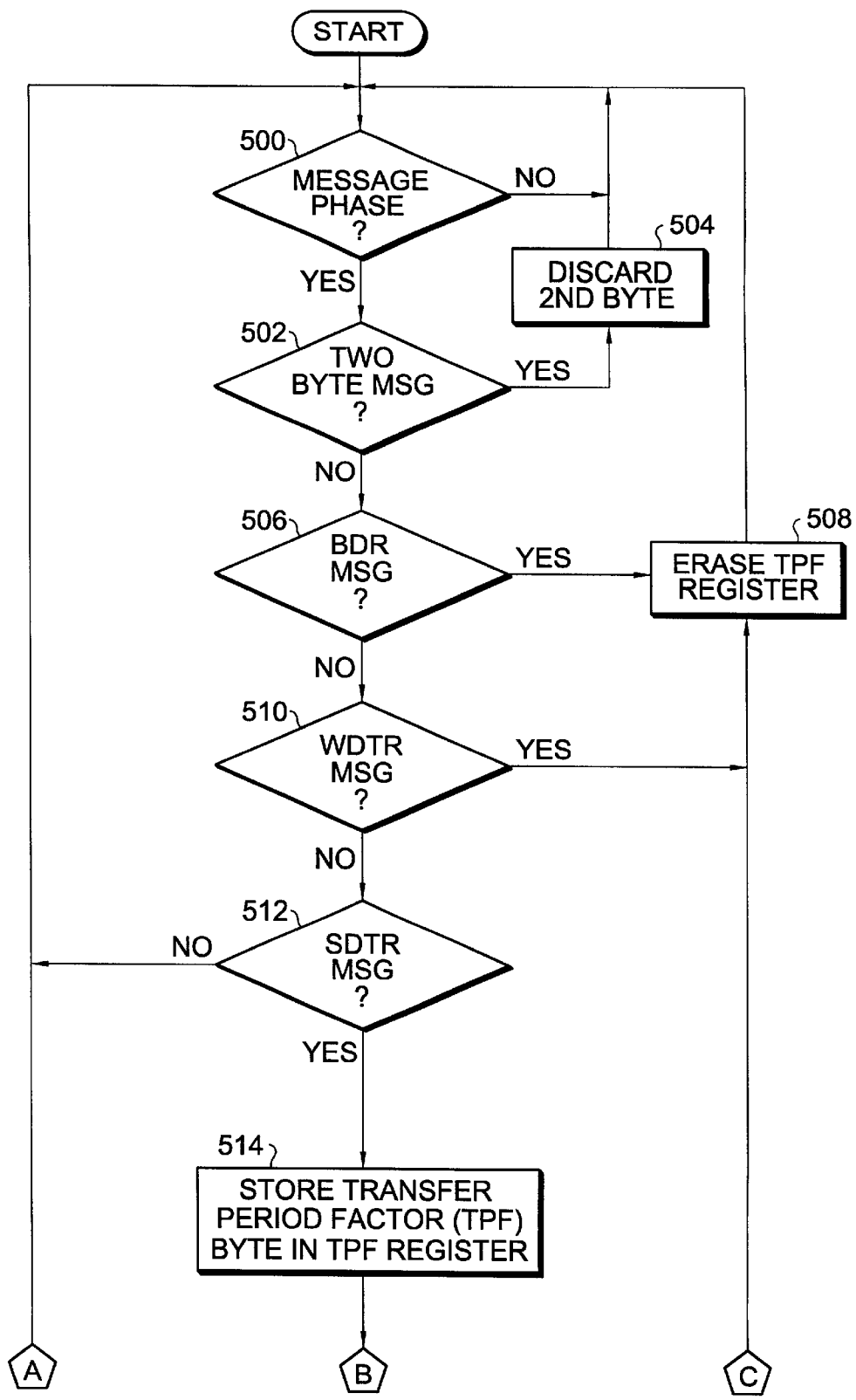
FIGS. 5A–5B together form a flowchart showing the series of steps followed by the expander when extracting the transfer rate set by two devices communicating over the bus on which the expander operates.
Figure 5B:
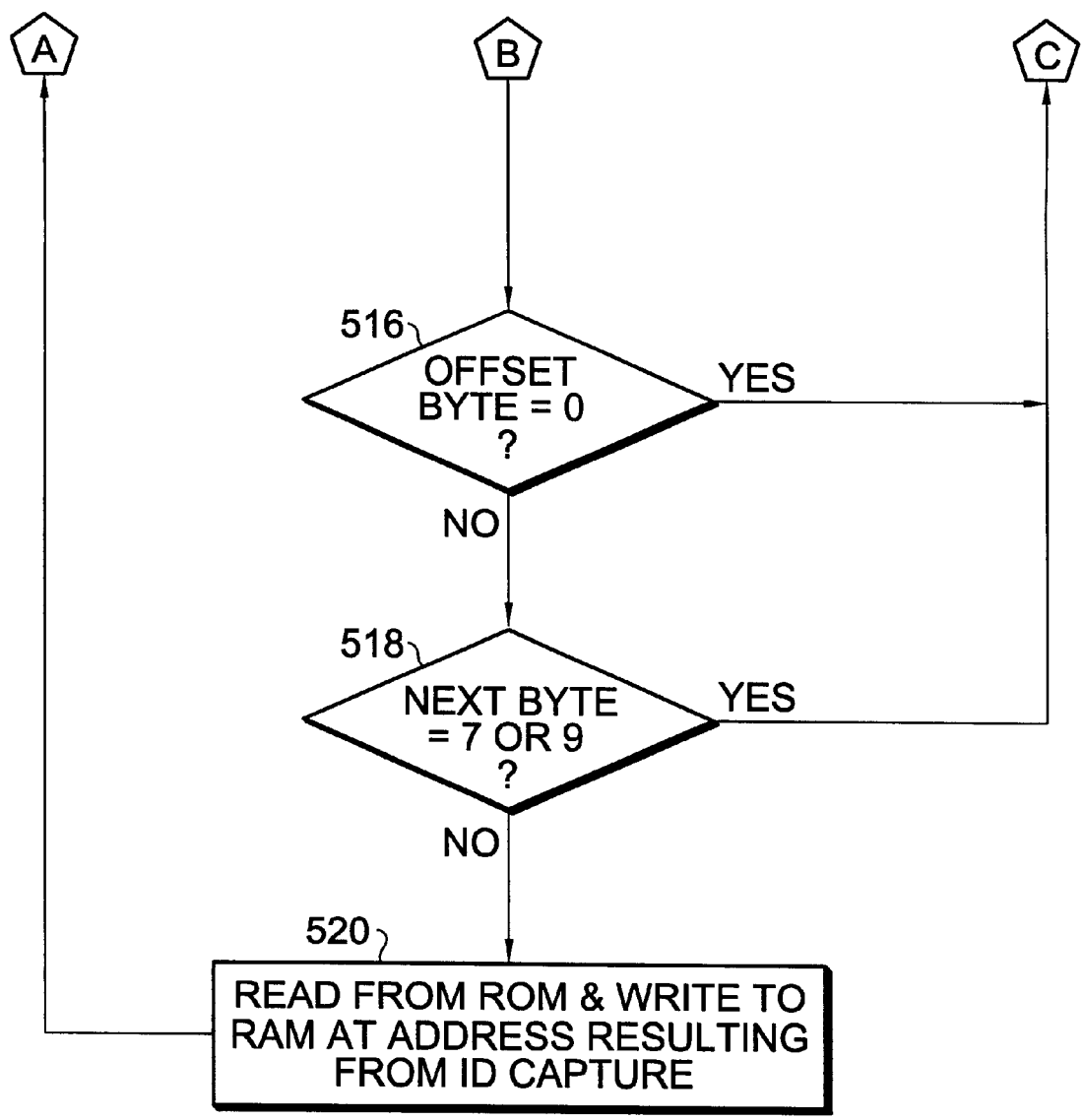

The flow diagram of FIGS. 5A–5B shows the process steps performed by the state machine 30 in extracting the transfer rate. First, it is necessary to determine when an SDTR message occurs on the bus. Starting with step 500, the process loops waiting for a message phase to begin. The message phase is indicated by the MSG line being asserted. During a SCSI message phase, the first byte of the message indicates what type of a message it is. In step 502, the state machine determines whether the detected message is a two-byte message and, if so, the second byte is discarded, so that it is not interpreted as a subsequent message, and the process returns to step 500.

If the message is not a two-byte message, the state machine 32 then determines the type of message through a series of tests. In step 506, it tests to see if the message is a "bus device reset" (BDR) message and, if so, proceeds to step 508, in which the TPF register is erased before the process returns to step 500. The register is erased because a BDR message is an indication that there was an error in the messaging phase, and any received data is no longer valid. A similar test occurs in step 510, in which it is determined whether the message is a "wide data transfer request" (WDTR) message. If so, width negotiations are done, and the prior speed negotiation is void. Therefore, confirmation of a WDTR message in step 510 results in the erasure of the TPF register in step 508, and a return to step 500.

If the message is neither a BDR nor a WDTR message, the state machine proceeds to step 512, in which it is determined whether the message is an SDTR message. If not, control is returned to step 500. However, if it is determined to be an SDTR message, the TPF value is stored in the TPF register 34 in step 514. Thereafter, the "offset" byte of the message is examined. The offset byte follows the data portion of the message, and is provided to indicate to the target how much of the data can be buffered up. This byte must be examined because, if it is zero, the two devices will terminate data transfer negotiations and default to asynchronous mode. Thus, in step 516 (FIG. 5B), the offset byte of the message is examined to determine whether it is zero and, if so, the state machine proceeds to step 508, erases the TPF register, and returns to step 500.

If the offset byte is not zero, the routine proceeds to step 517, in which it is determined whether the system is still in SCSI "message" phase. If not, the negotiations have been completed, and the routine proceeds to step 520. However, if the devices are still in a message phase, the state machine proceeds to step 518 in 30 which in determines whether there has been the transmission of either a "7" or a "9." In current SCSI protocol, these values represent, respectively, a rejection by the target devices, or a parity error. In either case, the process returns to step 508. If there is neither a "7" nor a "9" transmitted, the data is considered valid, and the TPF register is used as an address into ROM 36. Thus, in step 520, the state machine 30 triggers the "write" control on RAM 38, causing the appropriate transfer code output from ROM 36 to be stored in the RAM at the address output by the address register 40. Since this address is unique to the pair of devices that are negotiating the transfer rate indicated by the ROM output, a specific transfer rate is stored for that pair of devices. At this point, the routine returns to step 500.

Because the same two SCSI devices should always negotiate to the same transfer rate, once a value is stored in RAM 38 (FIG. 2) for each of the ID combinations, that value is simply output from the RAM to MUX 42 as soon as the appropriate address is decoded by state machine 32. The RAM 38 is normally in read mode, and the value of any given address is always present at its output and, therefore, at the input to multiplexer 42. Thus, when a data phase is detected, the new TPF code is output by the multiplexer. Prior to being loaded with a new TPF code, each RAM address is empty. However, during any negotiated transfer, the appropriate value is output before the data transfer actually begins.

While the invention has been shown and described with reference to a preferred embodiment thereof, it will be recognized by those skilled in the art that various changes in form and detail may be made herein without departing from the spirit and scope of the invention as defined by the appended claims. For example, the invention may be easily applied to SCSI buses of different widths, and may also be applied to non-SCSI parallel data transfer protocols. Furthermore, the specific components used herein are for descriptive purposes only, and other hardware and/or software solutions might be used to provide the adaptive pulse stretching or retiming functions of the invention.

What is claimed is:

1. Apparatus for reconditioning a first signal pulse transmitted along a transmission path accessible by a plurality of devices each of which is capable of transmitting signal pulses over, and receiving signal pulses from, the transmission path, wherein the rate at which the pulses are transmitted is different for different combinations of transmitting and receiving devices, the apparatus comprising:

a transmission path monitoring element that determines a first transmission rate that will be used during the time that the first signal pulse is transmitted;

a pulse receiving element that receives the first signal pulse; and a pulse transmitting element that retransmits the first signal pulse after it is received by the receiving element, a temporal characteristic of the retransmitted pulse being modified relative to the received pulse in response to the first transmission rate.

2. Apparatus according to claim 1 wherein said modified characteristic is the pulse width.

3. Apparatus according to claim 1 wherein said modified characteristic is a propagation delay relative to a second pulse.

4. Apparatus according to claim 1 wherein the apparatus further comprises a memory storage device for storing an indication of the transmission rate for each combination of transmitting and receiving devices.

5. Apparatus according to claim 1 wherein the transmission path is a SCSI bus and the monitoring apparatus comprises an ID detection apparatus that detects ID values of the devices involved in the transmission and reception of the first signal pulse.

6. Apparatus according to claim 5 wherein an indication of the transmission rate for each combination of transmitting and receiving device is stored in a memory storage device, and said ID values of the devices involved in the transmission and reception of the first signal pulse are used to determine an address in the memory storage element in which is stored the transmission rate used by the devices involved in the transmission and reception of the first signal pulses.

7. Apparatus according to claim 1 wherein the pulse receiving element and the pulse transmitting element comprise a delay line which receives the first pulse and retransmits the first pulse.

8. Apparatus according to claim 7 wherein the delay line is a first delay line which transmits the first pulse with a different pulse width than that with which it was received, and wherein the pulse receiving element and the pulse transmitting element further comprise a second delay line that transmits the first pulse with a different propagation delay relative to a second pulse than that with which it was received.

9. Apparatus according to claim 8 wherein the first and second delay lines are used for a first direction of data flow along the transmission path, and wherein the apparatus further comprises third and fourth delay lines substantially identical to the first and second delay lines, respectively, that are used for a second direction of data flow along the transmission path.

10. Apparatus according to claim 7 further comprising a tap value generator that generates a delay line tap value specific to the first transmission rate that is received by the delay line and causes the delay line to provide the retransmitted pulse with said modified characteristic.

11. Apparatus according to claim 7 wherein, for each direction of data flow along the transmission path, there is at least one delay line.

12. Apparatus according to claim 1 wherein the transmission path monitoring element further comprises a memory storage device for storing a transfer period factor generated by one of the transmitting and receiving devices.

13. Apparatus for reconditioning a first signal pulse transmitted along a transmission path accessible by a plurality of devices each of which is capable of transmitting signal pulses over, and receiving signal pulses from, the transmission path, wherein the rate at which the pulses are transmitted is different for different combinations of transmitting and receiving devices, the apparatus comprising:

a transmission path monitoring element that determines a first transmission rate that will be used during the time that the first signal pulse is transmitted;

a delay line that receives the first signal pulse and regenerates it with a temporal characteristic different than that of the pulse it receives; and a tap value generator that provides a tap value to the delay line which is specific to the transmission rate that is determined by the monitoring element, the tap value causing the delay line to regenerate the first signal pulse with said different temporal characteristic.

14. Apparatus according to claim 13 further comprising a second delay line that receives the first signal pulse and regenerates it with a propagation delay relative to a second pulse.

15. A method of reconditioning a first signal pulse transmitted along a transmission path accessible by a plurality of devices each of which is capable of transmitting signal pulses over, and receiving signal pulses from, the transmission path, wherein the rate at which the pulses are transmitted is different for different combinations of transmitting and receiving devices, the method comprising:

determining a first transmission rate to be used during the time that the first signal pulse is transmitted;

receiving the first signal pulse with a pulse receiving element; and retransmitting the first signal pulse after it is received by the receiving element, a temporal characteristic of the retransmitted pulse being modified relative to the received pulse in response to the first transmission rate, the modification to said characteristic being particular to the first transmission rate so as to improve the overall characteristics of the first signal pulse relative to the first transmission rate.

16. A method according to claim 15 wherein retransmitting the first signal pulse comprises retransmitting the first signal pulse such that said modified characteristic is the pulse width.

17. A method according to claim 15 wherein retransmitting the first signal pulse comprises retransmitting the first signal pulse such that said modified characteristic is a propagation delay relative to a second pulse.

18. A method according to claim 15 further comprising storing, in a memory storage device, an indication of the transmission rate for each combination of transmitting and receiving devices.

19. A method according to claim 15 wherein the transmission path is a SCSI bus, and wherein determining a first transmission rate comprises detecting ID values of devices involved in the transmission and reception of the first signal pulse.

20. A method according to claim 19 further comprising storing an indication of the transmission rate for each combination of transmitting and receiving devices in a memory storage device.

21. A method according to claim 15 wherein receiving and retransmitting the first signal pulse comprises receiving and retransmitting the first signal pulse with a delay line.

22. A method according to claim 21 further comprising generating a delay line tap value specific to the first transmission rate and transmitting it to the delay line such as to cause the delay line to provide the retransmitted pulse with said characteristic modification.

23. A method according to claim 15 further comprising storing, in a memory storage device, a transfer period factor generated by one of the transmitting and receiving devices.

24. A method of reconditioning a first signal pulse transmitted along a transmission path accessible by a plurality of devices each of which is capable of transmitting signal pulses over, and receiving signal pulses from, the transmission path, wherein the rate at which the pulses are transmitted is different for different combinations of transmitting and receiving devices, the method comprising:

determining a first transmission rate that will be used during the time that the first signal pulse is transmitted;

receiving the first signal pulse with a delay line that regenerates it with a temporal characteristic different than that of the pulse it receives; and providing a tap value to the delay line which is specific to the transmission rate that is determined by the monitoring element, the tap value causing the delay line to regenerate the first signal pulse with said different temporal characteristic.

* * * * *